(12) United States Patent
Walther

(10) Patent No.: US 6,443,384 B1
(45) Date of Patent: Sep. 3, 2002

(54) WIRE BRAKE

(75) Inventor: Frank Walther, Brakel (DE)

(73) Assignee: Hesse & Knipps GmbH (DE)

( * ) Notice: Subject to any disclaimer, the term of this patent is extended or adjusted under 35 U.S.C. 154(b) by 0 days.

(21) Appl. No.: 09/531,843

(22) Filed: Mar. 20, 2000

Related U.S. Application Data

(63) Continuation of application No. PCT/DE98/02793, filed on Sep. 21, 1998.

(30) Foreign Application Priority Data

Sep. 20, 1997 (DE) .......................... 197 48 014

(51) Int. Cl.[7] ................. B65H 59/14; B65H 20/30; B23K 37/00
(52) U.S. Cl. ................. 242/419.7; 226/118.2; 226/195; 228/4.5
(58) Field of Search ................. 242/419.4, 419.6, 242/419.7; 226/118.2, 195; 228/4.5, 8, 180.5

(56) References Cited

U.S. PATENT DOCUMENTS

| | | | |
|---|---|---|---|
| 2,595,270 A | | 5/1952 | Klein |
| 3,249,276 A | * | 5/1966 | Van Bergen et al. .... 219/137.2 |
| 3,799,215 A | * | 3/1974 | Willems ................. 219/137.8 |
| 4,559,886 A | | 12/1985 | Zylbert |
| 4,586,667 A | * | 5/1986 | Rodenbeck ............. 242/419.6 |
| 4,838,499 A | * | 6/1989 | Fohl ........................ 242/419.6 |
| 4,880,173 A | * | 11/1989 | Lachey .................... 242/419.4 |
| 4,928,871 A | * | 5/1990 | Farassat .................. 228/180.5 |
| 4,995,541 A | * | 2/1991 | Seidinger ..................... 226/174 |
| 5,653,380 A | * | 8/1997 | Haji ........................ 228/180.5 |
| 5,685,476 A | * | 11/1997 | Miyoshi ................. 228/180.5 |

FOREIGN PATENT DOCUMENTS

| | | |
|---|---|---|
| DE | 3519594 | 12/1986 |
| DE | 4337837 | 5/1995 |
| DE | 19633256 | 10/1997 |
| EP | 0498936 | 11/1991 |

* cited by examiner

Primary Examiner—Michael R. Mansen
(74) Attorney, Agent, or Firm—Baker Botts LLP

(57) ABSTRACT

A wire brake for use with automatic wedge bonding machines which have cutting pliers arranged behind the associated bonding tool and movable along the bonding wire for detaching bonding wire from the open pliers. The wire brake includes guiding members having a plurality of deflectors that can be applied to the bonding wire, the guiding members having two planes from which the bonding wire can be laterally deflected. A central deflector is provided for deflecting the bonding wire from the planes. The central deflector projects between the two planes for guidance of the bonding wire and is displaceable transverse to the longitudinal extension of the bonding wire. Additional guiding members are arranged opposite the planes such that the bonding wire rides between the central deflector and the additional guiding members when the bonding wire is deflected.

9 Claims, 1 Drawing Sheet

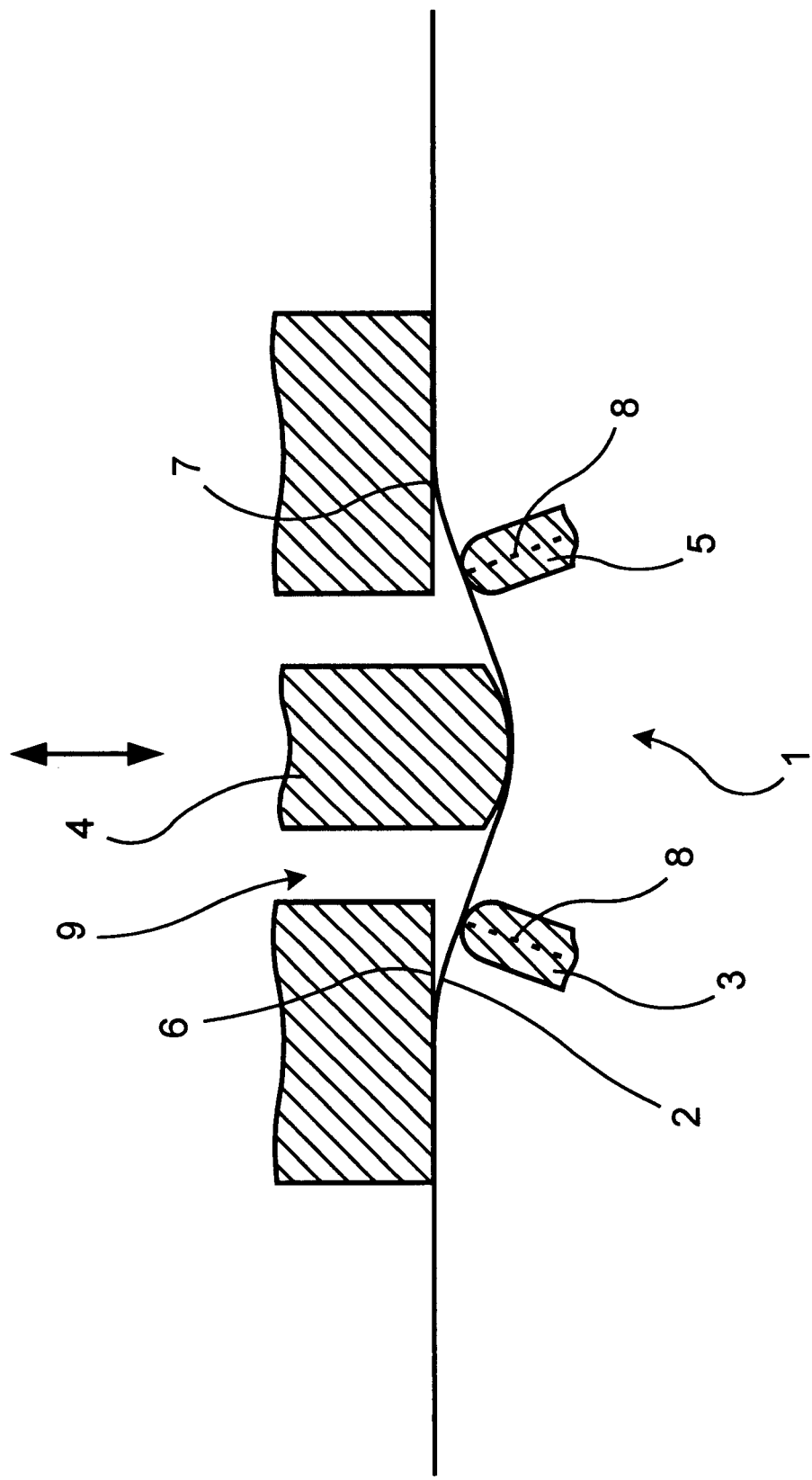

WIRE BRAKE

This is a continuation of copending International application No. PCT/DE98/02793 filed Sep. 21, 1998.

FIELD OF THE INVENTION

The invention relates to a wire brake and more particularly to a wire brake for automatic wedge bonding machines with cutting pliers arranged behind the associated bonding tool (wedge) and movable along the bonding wire for detaching a bonding wire from the open pliers.

BACKGROUND OF THE INVENTION

In automatic wedge bonding machines, cutting pliers serve for advancing the bonding wire under the wedge or for holding the bonding wire after completion of a wire bridge, i.e., of the second bonding contact for the purpose of detaching the bonding wire from the second bonding contact. An example of such an automatic bonding machine is found in DE 35 19 594 A1, or alternatively in DE 43 37 837 A1. In both cases the bonding wire must be gripped by the cutting pliers with a predetermined force. Then if the pliers are opened, the bonding wire adheres loosely to one of the jaws of the pliers. But should the automatic wedge bonding machine continue operation despite this unavoidable situation, the bonding process would be negatively affected. For example, irregular wire bridges or uneven tail lengths or even faulty bonds would then have to be expected.

In order to avoid this negative effect on the bonding process, it is generally customary to guide the bonding wire by two small felt pads, which act as a wire brake. Such wire brakes produce a sufficient force that reliably releases the bonding wire from the cutting pliers. In sustained operation, however, problems arise in that the felt bulges and individual loose fibers foul the bonding wire. In addition, dirt adhering to the bonding wire collects in the felt and is uniformly distributed on the bonding wire.

Another variant of realization of a wire brake consists in guiding the bonding wire to the cutting pliers in a Teflon tube. There use is made of the fact that the adhesive force between the bonding wire and the Teflon tube is greater than that between the bonding wire and one of the open jaws of the pliers. Although fouling of the bonding wire by the Teflon tube need not be expected, the undefined braking force must be considered a special disadvantage of this variant. This is the case especially with rapid movements of the bonding wire in the Teflon tube.

Another braking device has been disclosed in U.S. Pat. No. 2,595,270. In particular, a filament brake for yarn, in which the filament is guided through a row of pins, is described here. These pins are fastened on a base and project from it V-shaped alternately with an angle of opening of 10°. Thus the filament guided through the pins is alternately laterally deflected, so that a braking force is exerted on it. The more deeply the filament dips into the pins, the greater the magnitude of lateral deflection.

Here use is made of the fact that with increasing embrace of the pins, an increase of the braking force exerted on the filament develops.

However, such an accomplishment cannot be transferred to a brake for a bonding wire, since the bonding wire must in no way be permanently deformed mechanically upon feed to the wedge. This risk exists in the accomplishment according to U.S. Pat. No. 2,595,270, where excessive frictional forces are exerted simultaneously on the bonding wire.

SUMMARY OF THE INVENTION

The object of the invention therefore is to procure a wire brake in which the disadvantages of the prior art are avoided and with which it is possible to vary the required braking force.

In a wire brake of the type mentioned at the beginning, this object is accomplished in that the wire brake has guiding members that consist of a plurality of deflectors applicable to the bonding wire and has two planes between which the bonding wire, for producing a braking force, can be laterally deflected by a predetermined amount, in that a central deflector deflecting the bonding wire is provided which projects between the two planes for guidance of the bonding wire and is displaceable transverse to the longitudinal extension of the bonding wire, the bonding wire being lifted from the planes by the central deflector.

Production of a bending force on the bonding wire allows the required braking force to be predetermined in exactly defined fashion. In particular, it is of advantage here that the predetermined braking force is independent of the rate at which the bonding wire moves through the wire brake. This means that there will be no negative effect on bonding parameters.

In a preferred refinement of the invention the magnitude of lateral deflection is adjustable.

In an additional embodiment of the invention, a first and a second deflector, which are positioned at some distance apart, are provided opposite the central deflector, and the bonding wire is capable of bearing upon the first and second deflectors.

In order to prevent the guide surfaces themselves from exerting an effect on the braking force, the guide surfaces of the deflectors on which the bonding wire rides have a slightly arched or spherical surface in each instance.

In a preferred embodiment, the guide surfaces of the deflectors are polished.

In addition, it is of advantage if the first and second deflectors are aligned in such a way that the respective normal surface runs perpendicular to the bonding wire. In addition, the bonding wire in the inlet and outlet of the wire brake should be applied tangential to the planes. These measures ensure as small as possible a frictional force caused by the wire brake, so that the magnitude of the braking force is determined chiefly by the bending force.

BRIEF DESCRIPTION OF THE DRAWING

Further objects, features and advantages of the invention will become apparent from the following detailed description taken in conjunction with the accompanying FIGURE showing an illustrative embodiments of the invention, in which:

The FIGURE is a pictorial view of a wire brake in accordance with the present invention.

While the subject invention will now be described in detail with reference to the FIGURE, it is done so in connection with the illustrative embodiments. It is intended that changes and modifications can be made to the described embodiments without departing from the true scope and spirit of the subject invention as defined by the appended claims.

DETAILED DESCRIPTION OF PREFERRED EMBODIMENTS

The invention will be explained in detail below by means of an example which is illustrated the FIGURE. A wire brake 1 according to the invention is represented schematically in the accompanying drawing. This wire brake 1 consists of two planes 6, 7, between which a gap 9 is kept free and on which the bonding wire 2 rides.

In order to produce the required braking force for the bonding wire 2, the bonding wire 2 is laterally deflected by a center deflector 4, which is interposed in the gap 9 and is displaceable transverse to the longitudinal direction of the bonding wire 2. Lateral displacement of the center deflector 4 may be effected manually, for example by an adjusting screw, or alternatively by an automatic system, such as a voice-coil drive unit or the like.

To maintain deflection of the bonding wire with a uniform curvature in the elastic range, additional deflectors 3, 5, for instance facing the planes 6, 7, are provided. Deflectors 3, 5 may be fixed in position. The deflectors are preferably aligned in such a way that the respective normal surface 8 runs perpendicular to the bonding wire 2. This ensures that the bonding wire 2 is not drawn over an edge, which could lead to permanent deformation. Faulty bonds can arise from such deformation, since a deformed bonding wire 2 could no longer be positioned properly under the wedge. In addition, the deflectors 3, 5 cause the bonding wire 2 to be applied tangential to the planes 6, 7. This helps reduce the frictional force caused by the wire brake, so that the magnitude of the braking force is determined chiefly by the bending force.

The center deflector 4 causes the bonding wire to be deflected laterally far enough for it to contact the guide surfaces on the deflectors 3, 5. The magnitude of deflection of the bonding wire 2 determines the magnitude of the braking force, which may be varied according to the position of the center deflector 4.

In order to avoid surface effects of the guide surfaces on the deflectors 3, 4, 5, the latter are preferably designed with slightly arched or spherical contact surfaces, which are preferably polished to reduce friction.

Although the present invention has been described in connection with specific exemplary embodiments, it should be understood that various changes, substitutions and alterations can be made to the disclosed embodiments without departing from the spirit and scope of the invention as set forth in the appended claims.

What is claimed is:

1. A wire brake for automatic wedge bonding machines comprising cutting pliers arranged behind the associated bonding tool and movable along the bonding wire for detaching bonding wire from the open pliers, the wire brake comprising:

two planes with a gap therebetween on which said bonding wire rides, and a central deflector projecting in the gap between said planes and displaceable in a direction transverse to the longitudinal extension of said bonding wire to lift said bonding wire from said planes and deflect it transversely to its longitudinal extension, the deflection of said bonding wire from said planes producing the braking force.

2. The wire brake according to claim 1, wherein the magnitude of the transverse deflection of the bonding wire is adjustable by changing the transverse displacement of said central deflector.

3. The wire brake according to claim 1 wherein there are further provided first and second additional deflectors positioned in a spaced-apart relationship opposite respective ones of said two planes, said first and second additional deflectors contacting the bonding wire when said wire is deflected by the central deflector.

4. The wire brake according to claim 3 wherein said first and second additional deflectors are aligned such that a respective normal surface of each of said additional deflectors is substantially perpendicular to the path of the bonding wire.

5. The wire brake according to claim 1 wherein said central and additional deflectors have guide surfaces for contacting the bonding wire, said surfaces being arched.

6. The wire brake according to claim 5 wherein the guide surfaces of said deflectors are polished.

7. The wire brake according to claim 5 wherein the arching of the guide surfaces of said deflectors are formed to provide spherical guide surfaces for contacting the bonding wire.

8. The wire brake according to claim 7 wherein that the guide surfaces of the deflectors are polished.

9. The wire brake according to claim 1 wherein the bonding wire is applied substantially tangentially to the planes.

* * * * *